United States Patent
Berners et al.

(10) Patent No.: US 7,831,645 B1
(45) Date of Patent: Nov. 9, 2010

(54) DIGITAL RESONANT SHELF FILTER

(75) Inventors: David P. Berners, San Jose, CA (US);
Jonathan S. Abel, Menlo Park, CA (US)

(73) Assignee: Kind of Loud Technologies, LLC,
Santa Cruz, CA (US)

( * ) Notice: Subject to any disclaimer, the term of this patent is extended or adjusted under 35 U.S.C. 154(b) by 1274 days.

(21) Appl. No.: 11/249,162

(22) Filed: Oct. 11, 2005

Related U.S. Application Data

(60) Provisional application No. 60/617,343, filed on Oct. 8, 2004.

(51) Int. Cl.
*G06J 1/00* (2006.01)
*G06F 17/10* (2006.01)
(52) U.S. Cl. ..................................... 708/3; 708/300
(58) Field of Classification Search ................ 708/3, 708/801, 300–322
See application file for complete search history.

(56) References Cited

U.S. PATENT DOCUMENTS

| | | | | |
|---|---|---|---|---|
| 5,287,511 | A * | 2/1994 | Robinson et al. | 717/106 |
| 6,581,080 | B1 * | 6/2003 | Richards | 708/320 |
| 2004/0042625 | A1 * | 3/2004 | Brown | 381/103 |

OTHER PUBLICATIONS

Azizi, Seyed-Ali, "A New Concept of Interference Compensation for Parametric and Graphic Equalizer Banks", *Audio Engineering Soc., Convention Paper 5482*, Sep. 21-24, 2001, New York, NY, pp. 1-8.
Azizi, Seyed-Ali, "A New Concept of Interference Compensation for Parametric and Graphic Equalizer Banks", *Audio Engineering Soc., Convention Paper 5629*, May 10-13, 2002, Munich, Germany, pp. 1-8.
Berners, David P., et al., "Discrete-Time Shelf Filter Design for Analog Modeling", *Audio Engineering Soc., Convention Paper*, Oct. 11-13, 2003, New York, NY, pp. 1-5.
Blesser, Barry A., et al., "Audio Dynamic Range Compression for Minimum Perceived Distortion", *IEEE Transactions on Audio and Electroacoustics*, vol. AU-17, No. 1, Mar. 1969, pp. 22-32.

(Continued)

*Primary Examiner*—Tan V Mai
(74) *Attorney, Agent, or Firm*—Pillsbury Winthrop Shaw Pittman LLP

(57) ABSTRACT

A method and system for designing a discrete-time filter having a transfer function which approximates that of an analog shelf filter is disclosed. Prior art methods include applying the bilinear transform to the analog filter, which has the drawback of warping high-frequency features of the desired transfer function. In an embodiment of the present invention, an analog filter is designed which anticipates the warping imposed by the bilinear transform. For filters whose features approach the Nyquist limit, the inventive method provides a closer approximation to the analog response than direct application of the bilinear transform.

20 Claims, 8 Drawing Sheets

OTHER PUBLICATIONS

Bohn, Dennis A., "Constant-Q Graphic Equalizers", *Audio Engineering Soc., Convention Paper 2265-D-15*, Oct. 12-16, 1985, New York, NY, pp. 1-42.

Deczky, Andrew G., "Unispherical Windows", *IEEE*, 2001, pp. II-85-II-88.

Floru, Fred, "Attack and Release Time Constraints in RMS-Based Feedback Compressors", *J. Audio Eng. Soc.*, vol. 47, No. 10, Oct. 1999, pp. 788-804.

Kraght, Paul, "Aliasing in Digital Clippers and Compressors", *J. Audio Eng. Soc.*, vol. 48, No. 11, Nov. 2000, pp. 1060-1065.

Lang, Mathias C., "Least-Squares Design of IIR Filters with Prescribed Magnitude and Phase Responses and a Pole Radius Constraint", *IEEE*, 2000, pp. 3109-3121.

Mapes-Riordan, Dan, "A Worst-Case Analysis for Analog Quality (Alias Free) Digital Dynamics Processing", *J. Audio Eng. Soc.*, vol. 47, No. 11, Nov. 1999, pp. 948-952.

McGrath, David, et al., "Raised Cosine Equalization Utilizing Log Scale Filter Synthesis", *Audio Engineering Soc., Convention Paper 6257*, Oct. 28-31, 2004, San Francisco, CA, pp. 1-16.

Olveira, A.J., "A Feedforward Side Chain Limiter/Compressor/De-esser with Improved Flexibility", *J. Audio Eng. Soc.*, vol. 37, No. 4, Apr. 1999, pp. 226-240.

Orfanidis, S. J., "Digital Parametric Equalizer Design with Prescribed Nyquist Frequency Gain", *J. Audio Eng. Soc.*, vol. 45, No. 6, Jun. 1997, pp. 444-455.

Tarczynski, A., et al., "A WISE Method for Designing IIR Filters", *IEEE Trans. On Signal Proc.*, 2001, vol. 49, No. 7, Jul. 2001, pp. 1421-1432.

\* cited by examiner

DIGITAL RESONANT SHELF FILTER

CROSS-REFERENCE TO RELATED APPLICATIONS

The present application is based on, and claims priority from, U.S. Provisional Appln. No. 60/617,343, filed Oct. 8, 2004, commonly owned by the present assignee, the contents of which are incorporated herein by reference. This application is also related to commonly-owned and concurrently-filed U.S. application Ser. No. 11/249,159, the contents thereof also being incorporated herein by reference.

FIELD OF THE INVENTION

This invention pertains to the field of digital signal processing, and in particular to equalization and filtering, especially of audio signals.

BACKGROUND OF THE INVENTION

In the recording, production and playback of audio, one important and widely used tool is equalization, the manipulation of signal level and phase as a function of frequency. Equalization may be used to correct problems in a recorded signal, for instance to eliminate unwanted resonances in a drum track by suppressing energy in selected frequency bands, or to reduce a singer's lisp by enhancing certain high frequencies. Equalization is also often used for artistic purposes to give each instrument its own space in the audio band, or to create a certain feel—different genres of music, for instance, typically have different characteristic power spectra.

In mixing and mastering, probably the most commonly used equalizers are parametric sections and shelf filters. Parametric sections enhance or suppress a selected band of frequencies, whereas shelf filters apply a gain to all frequencies either above or below a prescribed frequency. Both first-order and second-order shelf filters are used, with the second-order or so-called resonant shelf filters sometimes having a resonant peak on one side or the other of the transition between its low-frequency and high-frequency gains.

Analog equalizers, such as the Pultec EQP-1A from Pulse Techniques, Inc. of Englewood, N.J., are highly prized for their sonic characteristics and user controls. It is desired to make digital emulations of these analog equalizers for use with digital audio workstations so as to provide the advantages of a software environment, such as automation, along with the sought-after sonic characteristics of vintage equalizers.

One of the most important characteristics of an analog equalizer is its transfer function, which results from a set of s-plane poles and zeros. To emulate such a filter in discrete time, two prior art approaches are used. In the first, the analog prototype filter is converted to the z-plane via the bilinear transform, as shown in FIG. 1.

As is known, bilinear transforms map the entire continuous-time frequency axis onto the unit circle in the z-plane. See, e.g., A. V. Oppenheim and R. W. Schafer, *Discrete-Time Signal Processing*, Prentice Hall, 1989. Using a bilinear transform, analog prototype filters can be carried into the discrete-time domain while preserving filter order and stability. Through the use of the bilinear warping constant, a single frequency in the continuous-time domain can be positioned anywhere on the unit circle in the z-plane. All other frequencies will be displaced by various amounts, with the amount of warping becoming more severe near the Nyquist limit. Because of its increased warping at higher frequencies, the bilinear transform is a poor choice for discrete-time modeling of filters with features near the Nyquist limit.

Another prior art approach is to process the input signal at a high sampling rate, as shown in FIG. 2. By using a sufficiently large oversampling factor, the Nyquist limit may be moved much higher than the relevant filter features, and the warping of those features by the bilinear transform will be minimized. However, this approach has the drawback of additional computational cost, and also introduces artifacts due to the upsampling process.

In a prior art method applicable to parametric sections, and described in S. J. Orfanidis, "Digital Parametric Equalizer Design with Prescribed Nyquist-Frequency Gain", *Journal of the Audio Engineering Society*, vol. 45, no. 6, pp. 444, June 1997, Orfanidis developed formulas which translate filter center frequency, gain and bandwidth into the coefficients of a second-order digital filter having a transfer function which interpolated the levels of the analog parametric filter at DC, the center frequency, and the Nyquist limit. This approach does not suffer from warping of the frequency axis as do the prior art methods based on the bilinear transform, and has the benefit that it is order preserving, and as such, the resulting filter is efficient to implement.

No such method is available for analog shelf filters. There remains a need in the art, therefore, to develop an efficient, order-preserving method for designing a digital filter having a transfer function which approximates that of an analog shelf filter.

SUMMARY OF THE INVENTION

A method and system for designing a discrete-time filter having a transfer function which approximates that of an analog shelf filter is disclosed. According to one aspect of the present invention, an intermediate analog filter is designed which anticipates the warping imposed by the bilinear transform. When the bilinear transform is applied to the intermediate analog filter, a discrete-time filter is obtained that more closely matches the desired characteristics of the analog filter. For filters whose features approach the Nyquist limit, the inventive method provides a closer approximation to the analog response than direct application of the bilinear transform.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE PREFERRED EMBODIMENTS

Figure 1:
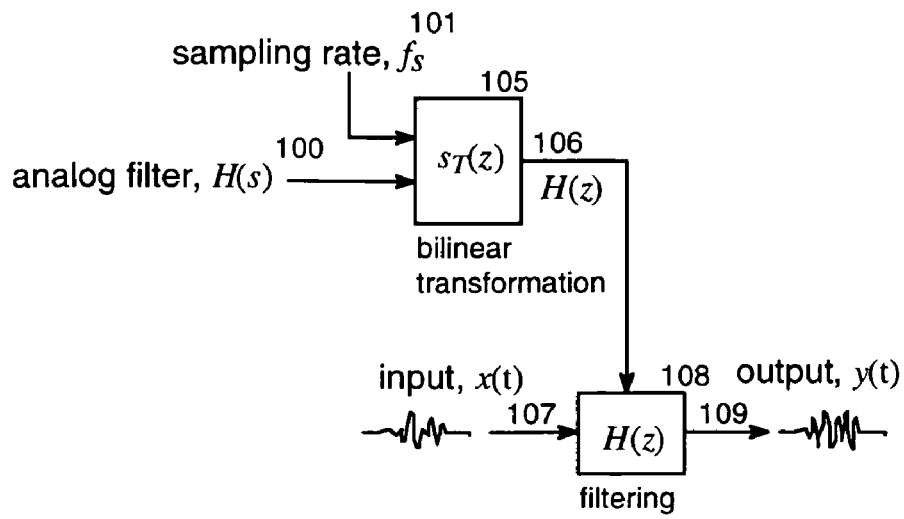
FIG. 1 illustrates a prior art system for digital equalization of a signal according to the characteristics of a desired analog filter, in which the desired analog filter is taken to the discrete-time domain via the bilinear transform.
Figure 2:
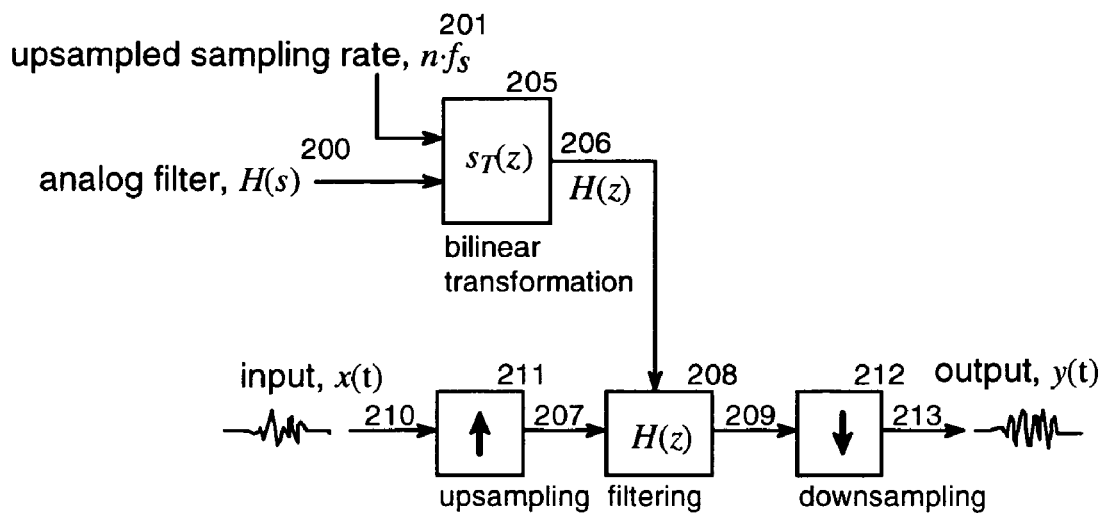
FIG. 2 illustrates a system for digital equalization of a signal according to the characteristics of a desired analog filter, in which the signal is upsampled and processed at the upsampled rate.

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

The inventive methods described herein will be discussed with respect to digital filters configured as second-order filters. It is understood, however, that the techniques discussed herein apply, with modifications that should be clear to those skilled in the art, to other filter structures, such as lattice and ladder filters, other filter orders, and to any number of implementation platforms, such as signal processing microprocessors and other discrete time systems.

Generally, the present invention recognizes that the second-order shelf filter typically makes use of two complex-conjugate poles and two complex-conjugate zeros to accomplish shelving. If the poles lie at a higher frequency than the zeros, the shelf is either a low-cut shelf or a high-boost shelf; otherwise, it is a low-boost or high-cut shelf. The poles and zeros can have independently varying amounts of resonance. Often, one set of features (either the poles or zeros) will be either critically damped or slightly underdamped, and the other set of features will have an adjustable amount of resonance.

The present invention further recognizes that in the design of the discrete-time filter, five features of the transfer function can be fixed, as afforded by the five independent coefficients available for use in the biquad (Eq. 0).

$$H(z) = \frac{b_0 + b_1 z^{-1} + b_2 z^{-2}}{1 + a_1 z^{-1} + a_2 z^{-2}} \tag{0}$$

Salient features of the shelf include: low- and high-frequency asymptotic gains, resonant frequencies of the poles and zeros, and response magnitudes at the resonant frequencies. Depending upon the locations and amounts of damping of the shelf resonances, each of these six features may become more or less important. In the present invention, criteria are given for the selection of features to be fixed in the filter design, and methods are disclosed for determining filter coefficients based on the desired features.

The overall approach of the present invention, therefore, is to design an analog prototype filter in such a way that when it is warped to the digital domain via a bilinear transform, important transfer function features are mapped to the desired frequencies. Specifically, the solution of the present invention is to design a prewarped analog prototype filter which is then converted to a digital filter via a bilinear transform.

Figure 3:
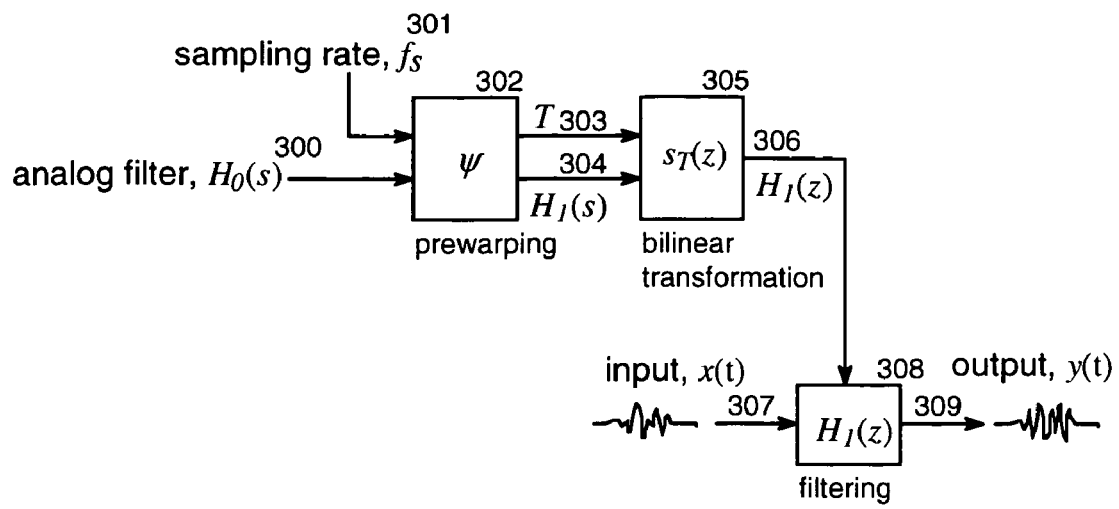
FIG. 3 illustrates an embodiment of the inventive system for digital equalization of a signal according to the features of a desired analog filter, in which the features are prewarped.

An embodiment of the inventive system is shown in FIG. 3. As shown in FIG. 3, given an analog filter $H_0(s)$ and sampling rate $f_s$, a pre-warping process 302 is performed to produce an intermediate pre-warped analog filter $H_1(s)$ and a bilinear warping constant T. Upon application of the bilinear transform 305 using these pre-warped values, the result is a discrete-time filter $H_1(z)$ having the desired specifications.

In one example, the inventive system in FIG. 3 is implemented as software operating on a computer system such as a Mac or Windows compatible system. In such a system, the inventive system can be included in a plug-in application for an audio production platform such as Pro Tools TDM HD from Digidesign of San Francisco, Calif. Such applications and platforms can include many other features and functionalities that are not necessary for an understanding of the present invention, such as receiving and formatting an audio signal input and analog filter characteristics, interacting with a user or other software components to select and/or change processing parameters, and providing an audio signal output to further applications. Those skilled in the art will be able to understand how to implement the inventive compressor in such plug-in applications and platforms after being taught by the present specification. However, the present invention is not limited to such applications.

Figure 5:
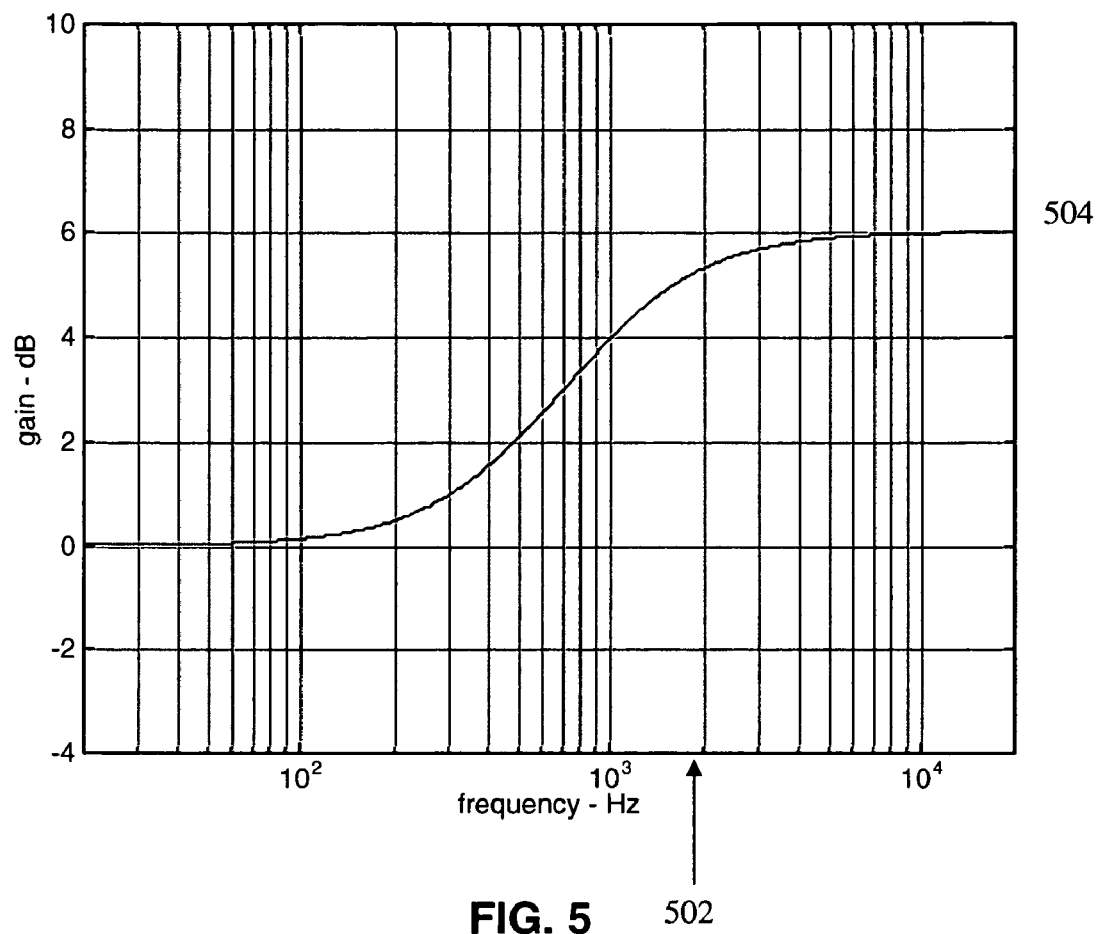
FIG. 5 is a graph illustrating a first-order high shelf filter transfer function magnitude.

The approach of the present invention will now be described in more detail beginning with reference to a typical high shelf filter as shown in FIG. 5. In particular, consider that a first-order analog high shelf filter has a transfer function given by $$H(s) = \frac{\frac{\gamma}{\omega_s^2}s^2 + \frac{2\sqrt{\gamma}}{\omega_s}s + 1}{\frac{1}{\omega_s^2}s^2 + \frac{2}{\omega_s}s + 1} \tag{1}$$

As illustrated in FIG. 5, the high shelf filter may be parametrized by the shelf frequency $\omega_s$ 502 and the high-frequency gain $\gamma$ 504. Standard analog second-order shelf-filter design for a high-shelf filter at frequency $\omega_s$ with asymptotic high-frequency gain $\gamma$ leads to a transfer function of:

$$H(s) = \frac{\frac{\gamma}{\omega_s^2}s^2 + \frac{2\sqrt{\gamma}}{\omega_s}s + 1}{\frac{1}{\omega_s^2}s^2 + \frac{2}{\omega_s}s + 1} \tag{2}$$

For a high-shelf cut-filter, the transfer function becomes $$H(s) = \frac{\frac{1}{\omega_s^2}s^2 + \frac{2}{\omega_s}s + 1}{\frac{\gamma}{\omega_s^2}s^2 + \frac{2\sqrt{\gamma}}{\omega_s}s + 1} \tag{3}$$

where $1/\gamma$ becomes the high-frequency asymptotic gain. The shelf transfer function can be generalized for a resonant shelf filter to:

$$H(s) = \frac{\frac{\gamma}{\omega_s^2}s^2 + \frac{\sqrt{\gamma}}{Q_x\omega_s}s + 1}{\frac{1}{\omega_s^2}s^2 + \frac{1}{Q_p\omega_s}s + 1} \quad (4)$$

Figure 6:
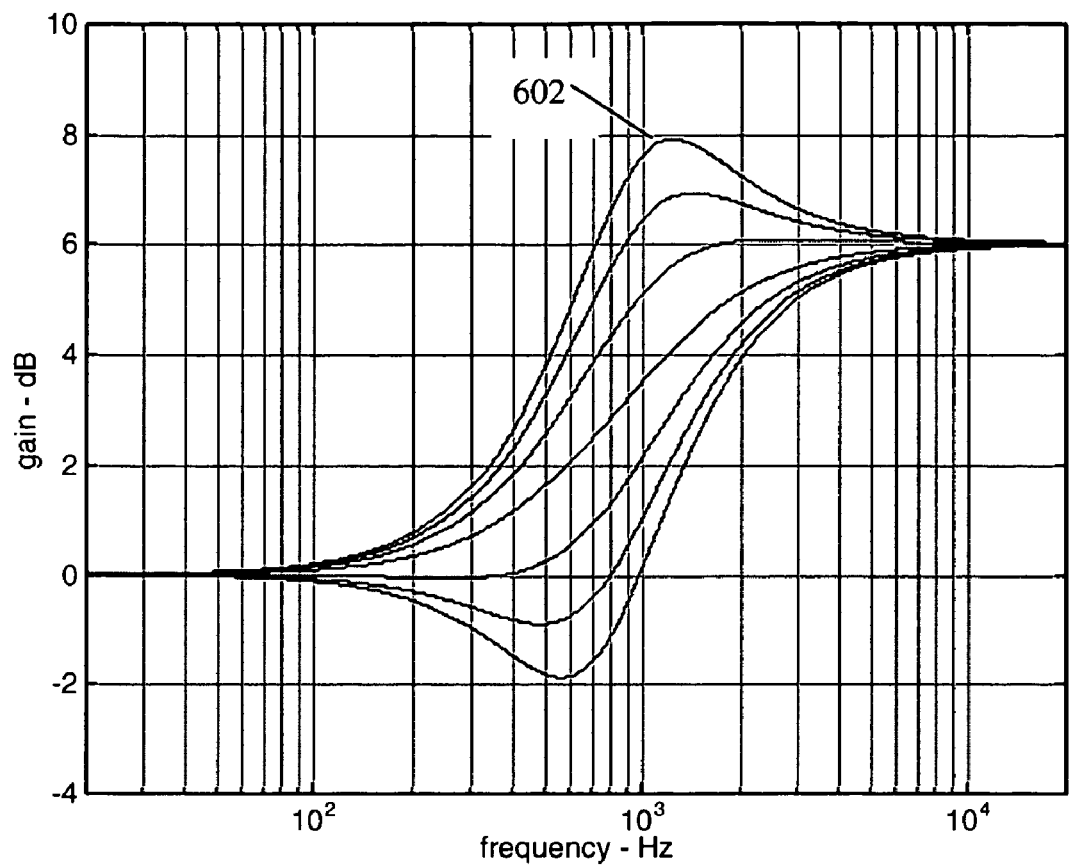
FIG. 6 is a graph illustrating a family of resonant shelf filters.

This transfer function is shown in FIG. 6. Note that a resonant feature 602 may appear on either side or both sides of the transition.

Figure 4:
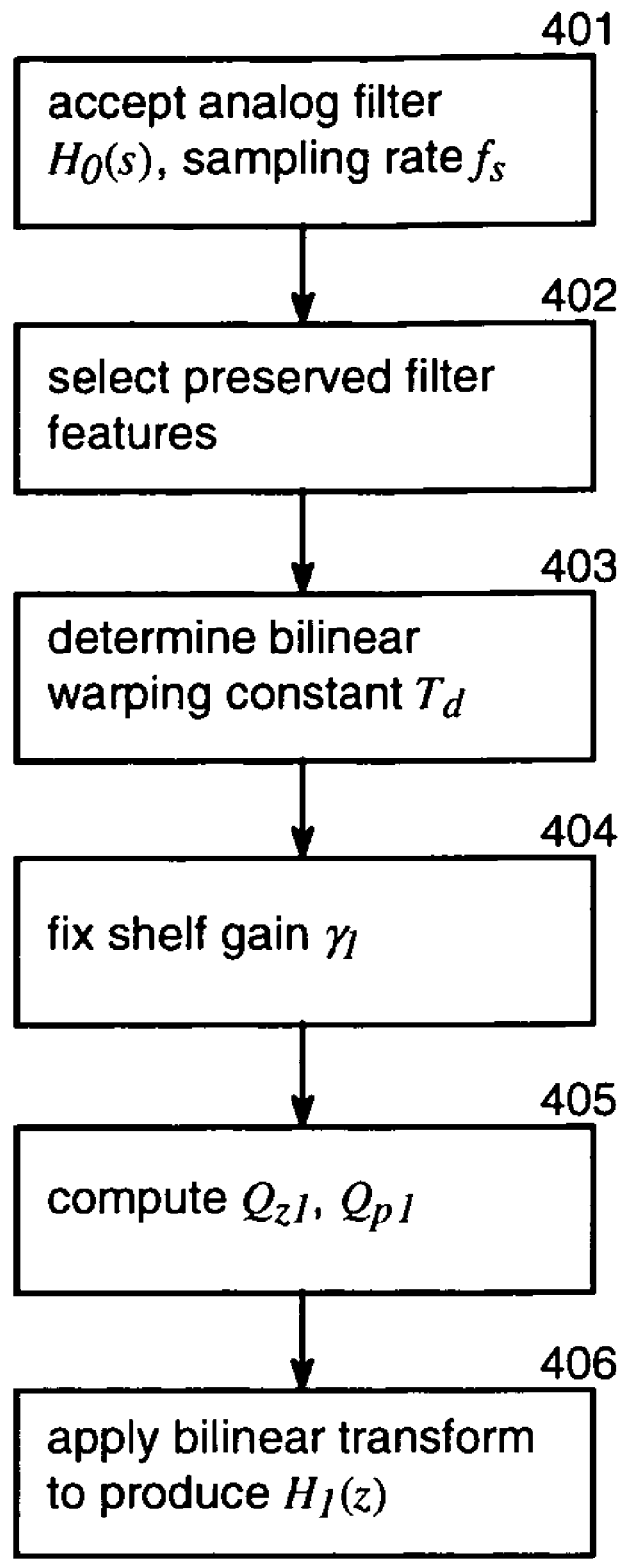
FIG. 4 illustrates an example digital shelf filter design method according to the invention.

According to the invention, therefore, to carry the shelf filter from the continuous-time to the discrete-time domain, the steps outlined in FIG. 4 may be taken. The first step 402 after identifying the analog filter in 401 is to determine which features of the filter's transfer function are desirable to preserve.

According to one aspect of the invention, the analog filter can be fully described by specification of the following features: Asymptotic Gain at DC; Asymptotic Gain at High Frequency; Q Associated With Poles; Q Associated With Zeros; Shelving Frequency where, for a high-shelf filter, the shelving frequency is defined as the frequency of the poles for a boost filter, or the frequency of the zeros for a cut filter. Those skilled will understand how to derive these features from a specified transfer function such as (4).

In further accordance with this example of the invention, in the discrete-time domain, there is a different set of features that may be more relevant for describing the transfer function: Frequency Locations of Resonant Peaks; Gains at Resonant Peaks; Asymptotic Gain at DC; Gain at Nyquist Limit. These features will be known to those skilled in the art, and can be easily derived from a specified transfer function such as (0).

In general, second-order filters have five degrees of freedom. For filters having only one resonant feature, there are only four characteristics to match between the domains—the DC and band-edge gains, and the location and gain of the resonant peak. Discrete filter design can thus be carried out with the addition of a fifth constraint. In one example of the invention, the filter gain at the frequency of the non-resonant feature is used to complete the set of constraints.

For filters without any resonant features, the constrained characteristics may be the DC and band-edge gains, the gains at the frequencies of the two non-resonant features, and the location in frequency of one of the non-resonant features.

For shelf filters with two resonant peaks, the system is overdetermined: The digital filter is characterized by six features. For accurate modeling of such filters in the discrete-time domain, higher order filters could be used. However, it is suggested that the methods disclosed herein be employed to design a filter which matches all the features, save the frequency of the broadest resonant feature.

Consider the following analog prototype resonant shelf filter.

$$H_0(s) = \frac{\frac{\gamma_0}{\omega_0^2}s^2 + \frac{\sqrt{\gamma_0}}{Q_{z0\omega_0}}s + 1}{\frac{1}{\omega_0^2}s^2 + \frac{1}{Q_{p0\omega_0}}s + 1}. \quad (5)$$

As discussed above in connection with an embodiment of the inventive system shown in FIG. 3, an aspect of the invention is to design a pre-warped analog filter $H_1(s)$ which, upon application of the bilinear transform, will result in a discrete-time filter meeting the specifications:

$$H_1(s) = \frac{\frac{\gamma_1}{\omega_1^2}s^2 + \frac{\sqrt{\gamma_0}}{Q_{z1\omega_1}}s + 1}{\frac{1}{\omega_1^2}s^2 + \frac{1}{Q_{p1\omega_1}}s + 1}. \quad (6)$$

The bilinear transform, given by:

$$s = \frac{2}{T_d}\left(\frac{1-z^{-1}}{1+z^{-1}}\right) \quad (7)$$

is applied to the pre-warped analog filter lids) with a bilinear warping constant given by (as shown in step 403 in FIG. 4)

$$T_d = \left(\frac{2}{\omega_0}\right)\tan\left(\frac{\omega_0}{2f_s}\right) \quad (8)$$

Since the resonant frequency of the shelf filter is $\omega_0$, this choice of Td will prevent the resonant frequency from being displaced by the bilinear transform. Thus, we can choose $\omega_1 = \omega_0$.

The DC gain of the shelf filter will be preserved across the bilinear transform, so nothing needs to be done in order to preserve this feature. However, in order to preserve the filter gain at the Nyquist limit, it is preferable to alter the transfer function in the analog domain.

The gain of the discrete-time shelf filter at the Nyquist limit will be equal to the asymptotic high-frequency gain of the analog prototype. Accordingly, in the next step 404 of the design process, we need to choose $$\gamma_1 = |H_0(f_s/2)|, \quad \text{or} \quad (9)$$

$$\gamma_1 = \left[\frac{\left(1 - \omega_\eta^2 \frac{\gamma_0}{\omega_0^2}\right)^2 + \left(\omega_\eta^2 \frac{\gamma_0}{Q_{z0}^5\omega_0^2}\right)}{\left(1 - \frac{\omega_\eta^2}{\omega_0^2}\right)^2 + \left(\frac{\omega_\eta^2}{Q_{p0}^2\omega_0^2}\right)}\right]^{1/2} \quad (10)$$

where $\omega_n = 2\pi f_s/2$.

At this point, all parameters have been determined except $Q_{p1}$ and $Q_{z1}$. Accordingly, in step 405 of FIG. 4, these parameters are determined next.

According to one example of the invention, these two parameters may be determined iteratively, in such a way that the resulting filter has the desired gains at $\omega_1$ and $\omega_1/\text{sqrt}(\gamma_1)$, the characteristic frequencies of the filter poles and zeros.

In order to carry out the iteration, we first need to obtain the desired gains $|H_{1Desired}(\omega_1)|$ and $|H_{1Desired}(\omega_1/\text{sqrt}(\gamma_1))|$. At $\omega_1$, this is straightforward. Since we have chosen $T_d$ in such away that $\omega_1$ is not displaced by the bilinear transform, we can simply set $|H_{1Desired}(\omega_1)| = |H(\omega_1)|$. However, in order to determine the desired gain for $H_1$ at $\omega_1/\text{sqrt}(\gamma_1)$, we need to evaluate $H_0$ at the frequency to which $\omega_1/\text{sqrt}(\gamma_1)$ will be warped by the bilinear transform. This frequency is readily found as $$\hat{\omega} = 2 \arctan\left(\frac{T_d \omega_1}{2\sqrt{\gamma}}\right) f_s \quad (11)$$

leading to $|H_{1Desired}(\omega_1/\text{sqrt}(\gamma_1))|=|H(\omega\text{-hat})|$.

Figure 7:
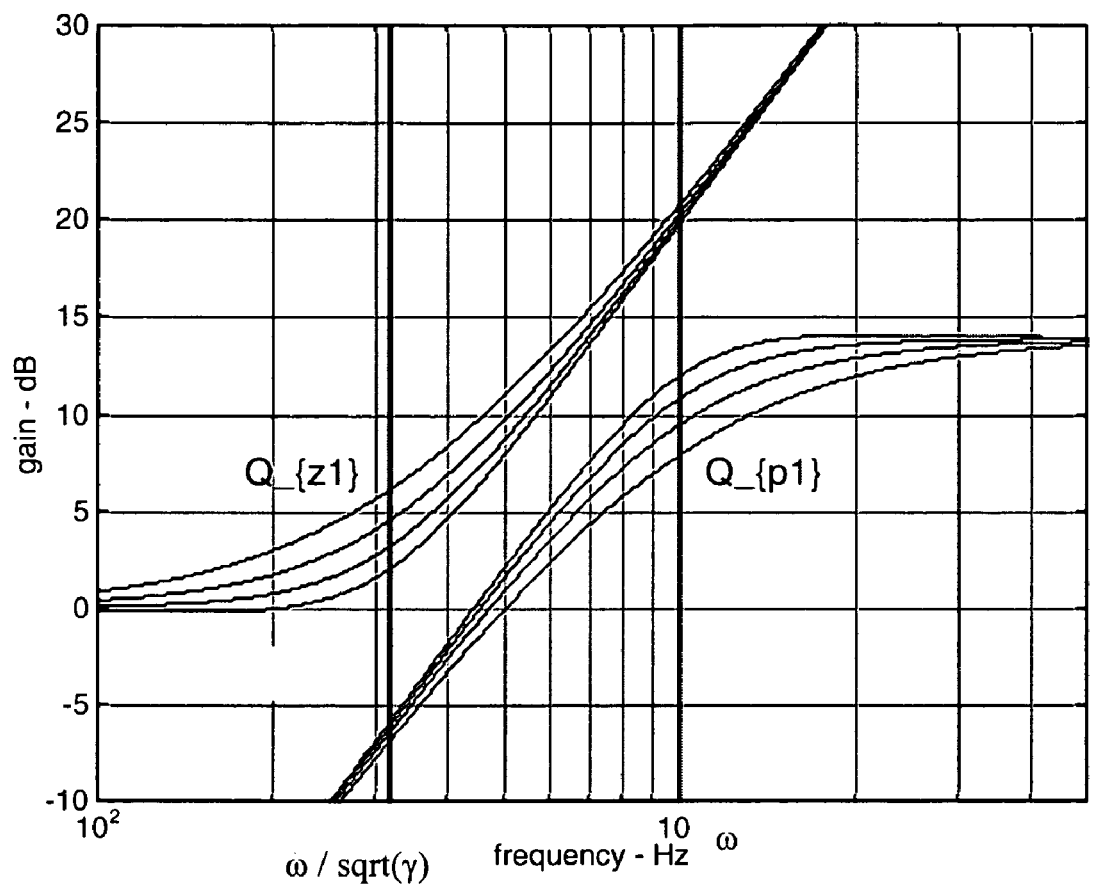
FIG. 7 is a graph illustrating an aspect of an iteration establishing parameters of the prewarped analog filter.

We now are able to set up an iterative adjustment to $Q_{p1}$ and $Q_{z1}$. $Q_{p1}$ will be adjusted based upon $|H_1(\omega_1)|$, while $Q_{z1}$ will be adjusted according to $|H_1(\omega_1/\text{sqrt}(\gamma_1))|$. Frequencies other than $\omega_1$ and $\omega_1/\text{sqrt}(\gamma_1)$ could be used as the basis for determining $Q_{p1}$ and $Q_{z1}$. However, as illustrated in FIG. 7 which shows the pole and zero transfer functions for a set of Q values, since $\omega_1$ and $\omega_1/\text{sqrt}(\gamma_1)$ are the natural frequencies of the poles and zeros of the filter, this choice provides the most robust and quickly converging iteration: a change in will affect the gain of $H_1$ at $\omega_1$ more than at any other frequency, and a change in $Q_{z1}$ will affect the gain of $H_1$ at $\omega_1/\text{sqrt}(\gamma_1)$ more than at any other frequency.

The iteration works as follows: Beginning with $Q_{p1}=Q_{p0}$ and $Q_{z1}=Q_{z0}$, 1. $Q_{p1}=Q_{p1}\cdot|H_{1Desired}(\omega_1)/H_1(\omega_1)|$
2. $Q_{z1}=Q_{z1}\cdot|H_1(\omega_1/\text{sqrt}(\gamma_1)/H_{1Desired}(\omega_1/\text{sqrt}(\gamma_1)|$
3. repeat After a handful of iterations, $Q_{p1}$ and $Q_{z1}$ will have converged to stable values. A very conservative nine iterations may be used to good effect for a wide variety of shelf filters.

The simple update expressions within the iteration result from the fact that, at the natural frequencies, the zeroth and second order terms of a resonator combine to zero, leaving the entire gain of the resonator proportional to the linear term:

$$\left|\frac{\gamma}{\omega_0^2}s^2 + \frac{\sqrt{\gamma}}{Q\omega_0}s + 1\right|\bigg|_{\omega=\frac{\omega_0}{\sqrt{\gamma}}} = \frac{1}{Q} \quad (12)$$

Figure 8:
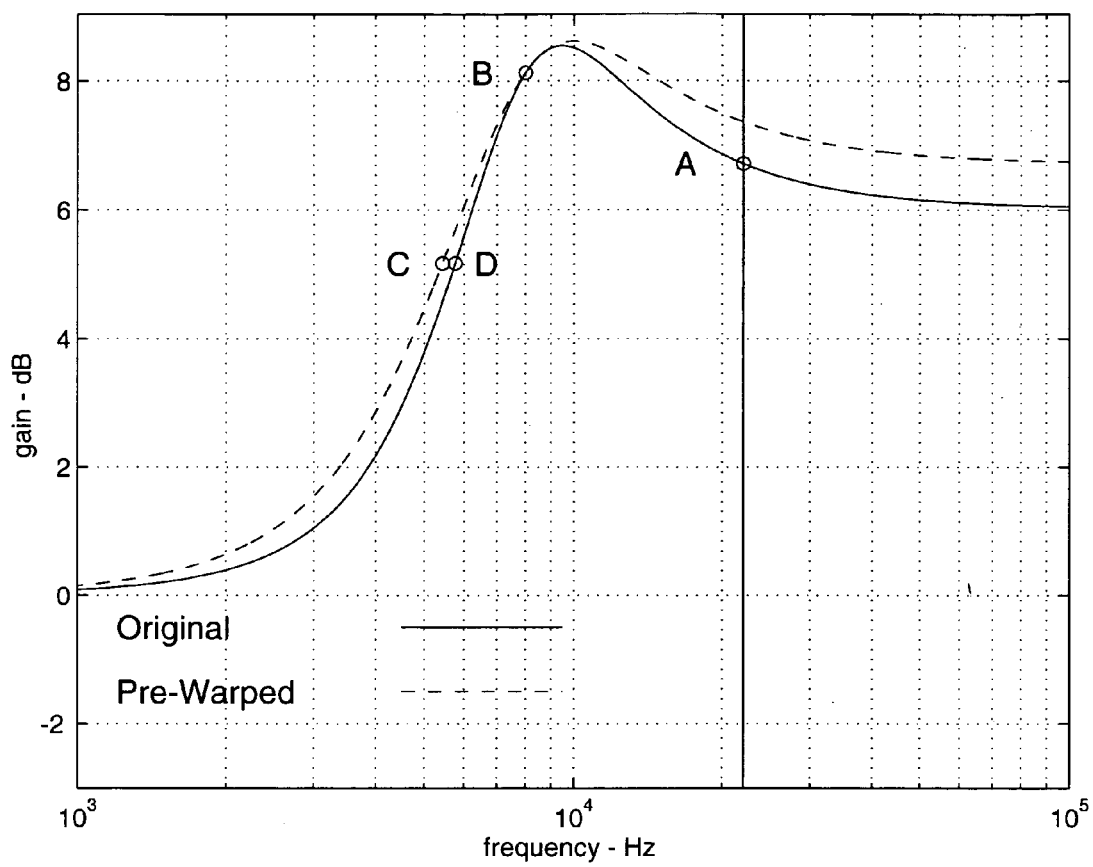
FIG. 8 is a graph illustrating example desired and prewarped analog shelf filters in accordance with the invention.
Figure 9:
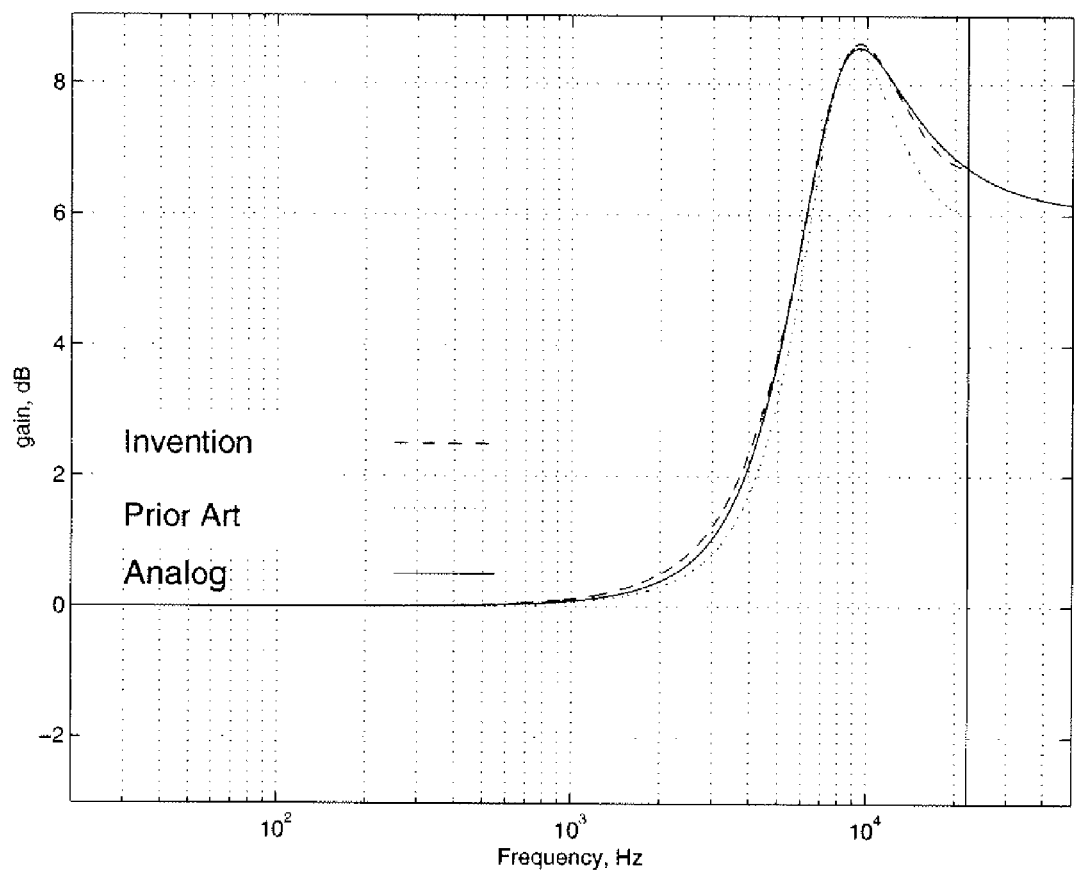
FIG. 9 illustrates an example shelf filter design in accordance with the invention, along with that of a prior art method.

Consider an example high-shelf analog filter $H_0$ with a DC gain of unity, a high-frequency gain of $\gamma_0=2$, a shelving frequency $f_0=\omega_0/2\pi$ of 8 kHz, a pole resonance of $Q_{p0}=\text{sqrt}(2)$, and a zero resonance of $Q_{z0}=\text{sqrt}(2)/2$. FIG. 8 shows the responses of the filters $H_0$ and $H_1$, designed in accordance with the teachings of this invention for a discrete-time sampling rate of 44.1 kHz. The original filter $H_0$ appears as a solid line, the pre-warped filter $H_1$ dashed. Various points on the plots show how the effects of the bilinear transform are accounted for by the pre-warped filter. The high-frequency asymptote of filter $H_1$ will be warped to point A on $H_0$, the Nyquist limit. Point B shows the natural frequency of the resonant poles. This point is kept fixed through our choice of bilinear warping constant $T_d$. Finally, point C on $H_1$ will be warped to point D on $H_0$.

Finally, as shown in step 405 of FIG. 4, a discrete-time filter $H_1(z)$ can be obtained by applying the bilinear transform to $H_1(s)$ with warping constant $T_d=(2/\omega_0)\tan(\omega_1/2f_s)$.

FIG. 10 shows the desired analog filter transfer function along with digital filters designed with the prior art method of applying the bilinear transform, and the inventive method of prewarping followed by application of the bilinear transform. Comparing the inventive discrete-time filter to the analog filter yields the following results: responses match at DC; responses match at Nyquist limit; responses match at characteristic frequency of poles; responses match at characteristic frequency of zeros of the discrete-time filter; characteristic frequencies of poles match for the two filters.

This exhausts the five degrees of freedom afforded by the biquad structure. As can be seen in FIG. 10, the inventive method provides a very close match to the desired analog filter characteristic, even at high frequencies, where the prior art method performs poorly.

Before concluding, note that when the zeros rather than the poles are resonant, the design method is similar, but with the bilinear warping constant given by $$T_d = \left(\frac{2}{\omega_0/\sqrt{\gamma_0}}\right)\tan\left(\frac{\omega_0/\sqrt{\gamma_0}}{2f_s}\right) \quad (13)$$

This is because the biggest resonance of the filter is now at $\omega_0/\text{sqrt}(\gamma_0)$. In order to preserve this resonance position when adjusting the gain at the Nyquist limit, for this filter $\omega_0$ and $\text{sqrt}(\gamma_0)$ must be adjusted proportionally, rather than simply adjusting $\omega_0$ as before. All other design steps remain unchanged.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modifications.

What is claimed is:

1. A computer-implemented method for equalizing a signal, comprising:
   accepting, at the computer, a desired analog shelf filter;
   determining a set of desired features describing the desired analog filter, the set of desired features including at least one feature of poles or zeroes of the desired analog filter;
   accepting, at the computer, a sampling rate;
   forming, by the computer, a bilinear warping constant based on the sampling rate and the set of desired features; and
   determining, by the computer, a set of prewarped features describing a prewarped analog shelf filter, such that when warped through the bilinear transform according to the bilinear warping constant, the set of prewarped features align with the set of desired features, including the feature of the poles or zeroes.

2. A method according to claim 1, further comprising:
   forming a discrete-time shelf filter by applying a bilinear transform with said warping constant to the prewarped analog shelf filter.

3. A method according to claim 2, further comprising:
   accepting said signal; and
   applying said discrete-time filter to said signal.

4. A method according to claim 1, wherein the set of desired features comprises two or more of asymptotic gain at DC, asymptotic gain at high frequency, Q associated with poles, Q associated with zeros, and shelving frequency.

5. A method according to claim 1, wherein the set of desired features includes a shelving frequency $\omega_0$, and wherein the bilinear warping constant $T_d$ is formed according to:

$$T_d = (2/\omega_0)\tan(\omega_0/2f_s)$$

where $f_s$ is the sampling frequency.

6. A method according to claim 1, wherein the set of desired features includes a shelf gain $\gamma_0$, $Q_{p0}$ associated with poles, $Q_{z0}$ associated with zeroes, and shelf frequency $\omega_0$, and the set of prewarped features includes shelf gain $\gamma_1$ which is computed by:

$$\gamma_1 = |H_0(f_s/2)|, \text{ or}$$

$$\gamma_1 = sqrt\left(\frac{(1-[\omega_n]^2(\gamma_0/[\omega_0]^2))^2 + ([\omega_n]^2(\gamma_0/[Q_{z0}]^2[\omega_0]^2))}{(1-[\omega_n]^2/[\omega_0]^2)^2 + ([\omega_n]^2/[Q_{p0}]^2[\omega_0]^2)}\right)$$

where $\omega_n = 2\pi f_s/2$ and $f_s$ is a sampling frequency.

7. A method according to claim 1, wherein the set of prewarped features include Q associated with poles $Q_{p1}$ and Q associated with zeroes $Q_{z1}$, and wherein the determining step includes iteratively determining Qp1 and Qz1 through an iterative process using desired gains at $\omega_1$ and $\omega_1/\text{sqrt}(\gamma_1)$, the characteristic frequencies of the filter poles and zeroes.

8. A method according to claim 1, wherein the feature includes one or both of a frequency location of the poles or zeroes and a gain associated with the poles or zeroes.

9. A method according to claim 1, wherein the poles or zeroes are associated with a non-resonant feature of the desired analog filter.

10. A method according to claim 1, wherein the poles or zeroes are associated with a resonant feature of the desired analog filter.

11. A method according to claim 1, wherein the set of desired features includes at least one feature of poles and at least one feature of zeroes of the desired analog filter.

12. A system for equalizing a signal, the system including a computer that is adapted to perform a plurality of functions comprising:
a function to convert a specified analog shelf filter to a prewarped analog shelf filter having a set of features, which when warped through a bilinear transform, will align with the corresponding set of features of the specified analog shelf filter, the set of features including at least one resonant feature; and
a bilinear transformation function that produces a digital filter version of the prewarped analog shelf filter that is operable in the discrete-time domain.

13. A system according to claim 12, wherein the set of features comprises two or more of asymptotic gain at DC, asymptotic gain at high frequency, Q associated with poles, Q associated with zeros, and shelving frequency.

14. A system according to claim 12, wherein the set of features includes a shelving frequency $\omega_0$, and wherein the function includes a function to form a bilinear warping constant $T_d$ according to:

$$T_d = (2/\omega_0) \tan(\omega_0/2f_s)$$

where $f_s$ is a sampling frequency.

15. A system according to claim 12, wherein the corresponding set of features of the specified analog filter includes a shelf gain $\gamma_0$, $Q_{p0}$ associated with poles, $Q_{z0}$ associated with zeroes, and shelf frequency $\omega_0$, and the set of features includes shelf gain $\gamma_1$ which is computed by:

$$\gamma_1 = |H_0(f_s/2)|, \text{ or}$$

$$\gamma_1 = sqrt\left(\frac{(1-[\omega_n]^2(\gamma_0/[\omega_0]^2))^2 + ([\omega_n]^2(\gamma_0/[Q_{z0}]^2[\omega_0]^2))}{(1-[\omega_n]^2/[\omega_0]^2)^2 + ([\omega_n]^2/[Q_{p0}]^2[\omega_0]^2)}\right)$$

where $\omega_n = 2\pi f_s/2$ and $f_s$ is a sampling frequency.

16. A system according to claim 12, wherein the set of features include Q associated with poles $Q_{p1}$ and Q associated with zeroes $Q_{z1}$, and wherein the function includes a function that iteratively determines Qp1 and Qz1 through an iterative process using desired gains at $\omega_1$ and $\omega_1/\text{sqrt}(\gamma_1)$, the characteristic frequencies of the filter poles and zeroes.

17. A system according to claim 12, wherein the feature includes one or both of a frequency location of the poles or zeroes and a gain associated with the poles or zeroes.

18. A system according to claim 12, wherein the poles or zeroes are associated with a non-resonant feature of the desired analog filter.

19. A system according to claim 12, wherein the poles or zeroes are associated with a resonant feature of the desired analog filter.

20. A computer-implemented method for digitally processing a signal, comprising:
accepting, at the computer, a desired analog shelf filter;
determining a frequency location of at least one pole or zero of the desired analog shelf filter, a shelf gain and a shelf frequency of the desired analog filter;
accepting, at the computer, a sampling rate;
forming, by the computer, a bilinear warping constant based on the sampling rate and the shelf frequency; and
determining, by the computer, an intermediate pole or zero frequency location, an intermediate shelf gain and an intermediate shelf frequency of a prewarped analog shelf filter, such that when the prewarped analog shelf filter is warped through the bilinear transform according to the bilinear warping constant, a resulting digital filter has a resulting pole or zero frequency location, resulting shelf frequency and resulting shelf gain that are approximately the same as the pole or zero frequency location, shelf frequency and shelf gain.

* * * * *